(12) United States Patent
Boyd

(10) Patent No.: US 7,154,170 B2
(45) Date of Patent: Dec. 26, 2006

(54) SEMICONDUCTOR PACKAGE SECURITY FEATURES USING THERMOCHROMATIC INKS AND THREE-DIMENSIONAL IDENTIFICATION CODING

(75) Inventor: Patrick D. Boyd, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 10/816,408

(22) Filed: Mar. 31, 2004

(65) Prior Publication Data

US 2005/0224791 A1    Oct. 13, 2005

(51) Int. Cl.
*H01L 23/02* (2006.01)
*G02F 1/01* (2006.01)
*G09G 3/34* (2006.01)
*G03C 3/00* (2006.01)

(52) U.S. Cl. .................. 257/679; 359/288; 345/106; 430/10

(58) Field of Classification Search ............... None
See application file for complete search history.

(56) References Cited

U.S. PATENT DOCUMENTS

| | | | | |
|---|---|---|---|---|
| 4,922,242 A * | 5/1990 | Parker | ............ | 345/106 |
| 5,223,958 A * | 6/1993 | Berry | ............ | 349/20 |
| 5,673,028 A | 9/1997 | Levy et al. | | |
| 6,229,514 B1 * | 5/2001 | Larson | ............ | 345/101 |
| 6,444,377 B1 * | 9/2002 | Jotcham et al. | ............ | 430/10 |
| 6,580,413 B1 * | 6/2003 | Walsh | ............ | 345/105 |
| 6,616,190 B1 * | 9/2003 | Jotcham | ............ | 503/200 |
| 6,665,406 B1 * | 12/2003 | Phillips | ............ | 380/54 |
| 6,800,106 B1 * | 10/2004 | Cogar et al. | ............ | 55/385.6 |
| 6,872,453 B1 * | 3/2005 | Arnaud et al. | ............ | 428/432 |
| 2003/0052305 A1 | 3/2003 | Coates et al. | | |
| 2004/0017295 A1 | 1/2004 | Dishongh et al. | | |

FOREIGN PATENT DOCUMENTS

| | | |
|---|---|---|
| EP | 1 066 978 A | 1/2001 |
| EP | 1 243 442 A | 9/2002 |
| JP | 63 244652 A | 10/1988 |
| JP | 11 154210 A | 6/1999 |
| WO | PCT/US2005/010531 | 8/2005 |

* cited by examiner

*Primary Examiner*—Alonzo Chambliss
(74) *Attorney, Agent, or Firm*—Blakely, Sokoloff, Taylor & Zafman LLP

(57) ABSTRACT

Numerous embodiments of an apparatus and method for generating an identification feature are described. In one embodiment of the present invention, portions of an identification character printed with thermochromatic ink are distributed within a three-dimensional matrix of a multi-layer patch. The multi-layer patch may be disposed above a substrate.

15 Claims, 9 Drawing Sheets

SEMICONDUCTOR PACKAGE SECURITY FEATURES USING THERMOCHROMATIC INKS AND THREE-DIMENSIONAL IDENTIFICATION CODING

TECHNICAL FIELD

Embodiments of the present invention relate to the field of semiconductor processing and the fabrication of integrated circuits.

BACKGROUND

Security features are typically employed in semiconductor packages (e.g., computer chip packages) in an effort to prevent or deter counterfeiting, or to detect counterfeit products more easily. For example, a computer chip package may be encoded with a unique product identification number or symbol by laser markings, laser holograms, or microprints.

Laser markings, microprints, and holograms are easily reproducible with the proper equipment, making them ineffective security methods for distinguishing an original from a counterfeit product. As such, a consumer may not be able to distinguish between a counterfeit chip package from an original chip package by mere visual inspection of the printed security identification marking. These security methods also have very limited encryption capabilities. In order to ensure that a product is an original, extensive and time consuming performance tests are required to ensure that the chip package is not a counterfeit product. As such current security measures are problematic and do little to deter future attempts at counterfeiting.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
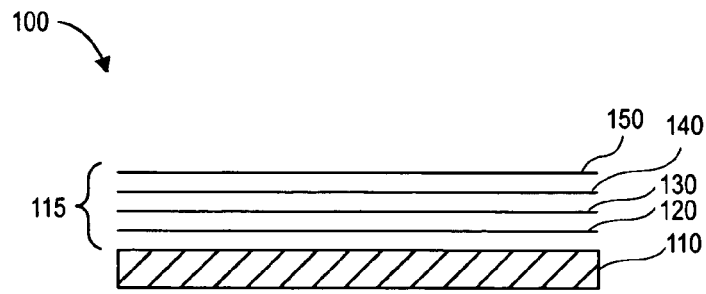
FIG. 1A illustrates a cross-sectional side view of one embodiment of a multi-layered thermochromatic patch.

In the following description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

The terms "on," "above," "below," "between," and "adjacent" as used herein refer to a relative position of one layer or element with respect to other layers or elements. As such, a first element disposed on, above or below another element may be directly in contact with the first element or may have one or more intervening elements. Moreover, one element disposed next to or adjacent another element may be directly in contact with the first element or may have one or more intervening elements.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Numerous embodiments of an apparatus and method for generating an identification feature are described. For clarity of explanation, the various embodiments herein are described with respect to providing identification features or characters for semiconductor-based devices such as semiconductor chip or processor packages. However, it may be appreciated that embodiments described herein may be utilized with any type of product requiring the implementation of an identification security feature such as documents and currency.

In one embodiment of the present invention, a multi-layered patch has one or more thermochromatic inks deposited or printed on each layer. The thermochromatic inks may be tuned to change color at a specific activation temperature. Alternatively, the thermochromatic inks may be tuned to become translucent or transparent at a particular activation temperature. In other words, the thermochromatic inks may be chosen from formulations that change from a first color to a second color (or become colorless) at a selected temperature. The combination of the thermochromatic inks on each layer may be customized to generate a unique rendering of an identification character, label, number, symbol, or logo for a particular semiconductor chip associated with the identification mark, character, or alphanumeric identifier. The use of thermochromatic inks in a multi-layered patch provides for a nearly unlimited number of identification renderings, making counterfeiting of the identification character difficult, as described in greater detail below. As such, genuine or original products may be distinguished from counterfeit products with a secure identification feature associated with the product, as well as deterring the counterfeiting of such products.

Figure 1B:
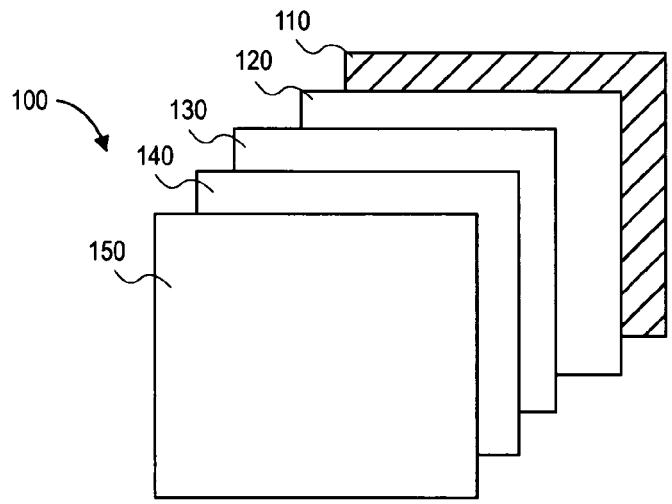
FIG. 1B illustrates an exploded view of the multi-layered thermochromatic patch of FIG. 1A.
Figure 1C:
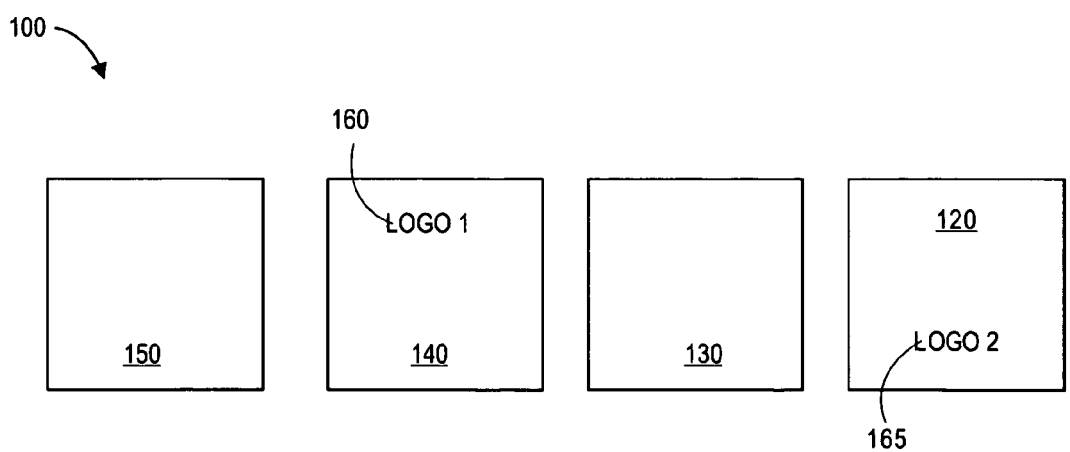
FIG. 1C illustrates a separated view of the multi-layered thermochromatic patch of FIG. 1A.

FIGS. 1A–1C are various perspective views of one embodiment of a multi-layered identification patch having thermochromatic inks. Semiconductor package 100 includes a multi-layer security patch 115 disposed over a substrate 110. Patch 115 has four layers 120, 130, 140, and 150 and are substantially aligned on top of each other as shown in the cross-sectional view of FIG. 1A. Layer 130 is disposed above layer 120, layer 140 is disposed above layer 130, and layer 150 is disposed above layer 140. As such, layer 120 is the bottommost layer and layer 150 is the topmost layer relative to substrate 110. The spacing between substrate 110 and layer 120, as well as the spacing between each layer are not shown to scale but drawn in a way for clarity of explanation. FIG. 1B illustrates an exploded view of semiconductor package 100 with of each of the layers 120, 130, 140, and 150 disposed above substrate 110. The layers may be substantially similar in size and stacked above substrate 110. Each layer is represented as having a substantially square shape, but other shapes and sizes may be used for the layers that make up patch 115. Substrate 110 is also-illustrated as being substantially similar in size and shape to the layers of patch 115. In alternative embodiments of the present invention, substrate 110 may be larger than the size of patch 115 and/or have a different shape. In one embodiment, patch 115 may be any area defined by a stack of thermochromatic or non-thermochromatic layers on substrate 110, and not necessarily the object or article which serves as substrate 110. Substrate 110 may be any type of semiconductor-based device including but not limited to, a computer chip, carrier substrate, printed circuit board, or other computer components disposed on a printed circuit board.

FIG. 1C illustrates each layer of patch 115 separated from each other in order to show with clarity the various thermochromatic markings on each layer, if present. Layer 140 may be substantially transparent but with a first thermochromatic marking 160, represented by "LOGO 1," and layer 120 may also be substantially transparent but with a second thermochromatic marking 165, represented by "LOGO 2." First thermochromatic marking 160 may be tuned to a particular activation temperature to change from a first color to a second color. Similarly, second thermochromatic marking 165 may also be tuned to a different, unique activation temperature to change from a first color to a second color. Layers 130 and 150 may also be thermochromatic. For example, layers 130 and 150 may become translucent or transparent at a particular activation temperature. In one embodiment of the present invention, first and second thermochromatic markings 160, 165 may be part of an identification character for substrate 110. As described in greater detail below, first and second thermochromatic markings 160, 165 allow for distributing an identification character within the three-dimensional matrix of patch 115. In one embodiment, the three-dimensional matrix of patch 115 refers to the relative positions within patch 115 that are available for printing or disposing inks to generate an identification character. For example, inks may be printed on a surface area of a particular layer (i.e., X-Y axis) as well as on different layers stacked on each other (i.e., Z-axis).

Figure 2A:
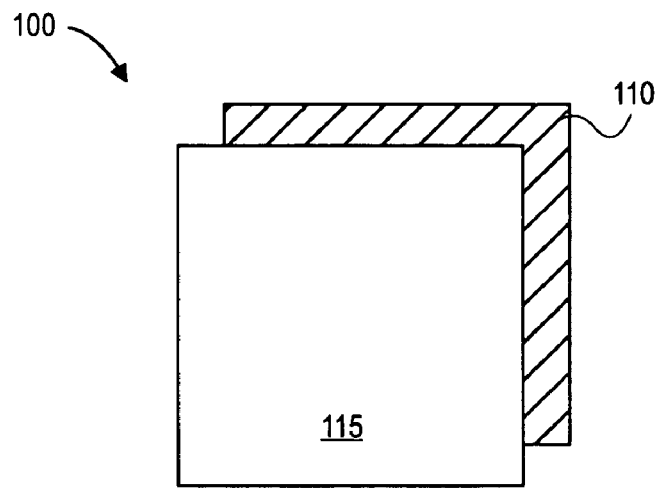
FIGS. 2A–2C illustrate one embodiment of the progression of generating an image by the multi-layered thermochromatic patch of FIGS. 1A–1C.
Figure 2B:
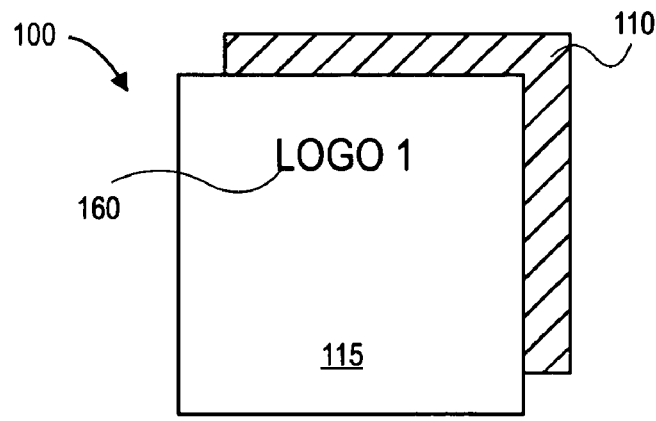
Figure 2C:
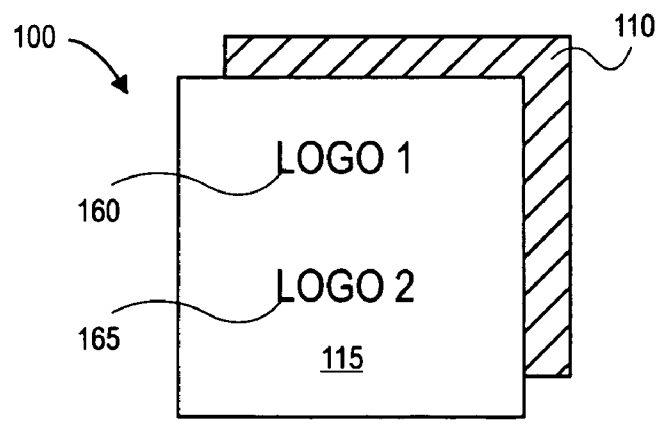

FIGS. 2A–2C illustrate the progression of displaying an identification character for substrate 110 from first and second thermochromatic markings 160, 165 by gradually raising the temperature of patch 115 through a series of activation temperatures tuned to each layer and/or markings on each layer. As such, FIGS. 2A–2C should be understood with respect to semiconductor package 100 described above with respect to FIGS. 1A–1C. FIG. 2A illustrates patch 115 disposed above substrate 110 (depicted three-dimensionally) at a resting temperature, or any temperature that is below any one activation temperature. This may be, in one embodiment, ambient or room temperature. In one embodiment of the present invention, the resting temperature may be the operating temperature range of a computer chip, but below the activation temperatures of the thermochromatic inks. No identification characters are visible initially (i.e., the color coated top layer 150 blocks or covers layers 140, 130, and 120). As the temperature of patch 115 is raised to a first activation temperature, top layer 150 becomes transparent to reveal layer 140 with first thermochromatic marking 160, as illustrated in FIG. 2B. Alternatively, first thermochromatic marking 160 may have a separate activation temperature that changes from a first color to a second color (e.g., black to red) when patch 115 reaches a second activation temperature tuned to thermochromatic marking 160.

As the temperature of patch 115 continues to rise, the activation temperature of layer 130 is reached, causing layer 130 to become transparent and reveal second thermochromatic marking 165 on layer 120, as illustrated in FIG. 2C. Alternatively, second thermochromatic marking 165 may have a higher, unique activation temperature that changes the color of second thermochromatic marking 165 from a first color to a second color (e.g., green to violet). As such, the proper chromatic image of the identification character for substrate 110 is not revealed until the activation temperatures for each layer and/or thermochromatic markings are reached. As such, the identification character may be part of a three-dimensional matrix in which a first character portion is disposed on one layer (e.g., layer 140) and a second portion disposed on a different layer (e.g., layer 120). The complete identification character is not revealed until the activation temperatures of the layers (i.e., 130, 150) above each character portion become transparent. Another level of security may be added to the identification character by associating a unique color combination (e.g., first thermochromatic marking being a particular color and second thermochromatic marking being a second particular color). The layers and thermochromatic markings of patch 115 are arranged such that the layer with the lowest activation temperature is disposed as the topmost layer and the layer with the highest activation energy is disposed as the bottommost layer relative to substrate 110. It may be appreciated, however, that in alternative embodiments of the present invention, any activation order may be employed depending on the particular chromatic identification character to be generated.

In one embodiment, the thermochromatic markings and layers may be one of various thermochromatic dyes and inks including, but not limited to, leucodyes, N-isoproplyacrylamide ("NIPAM"), thermochromatic liquid crystals, and other color changing inks known in the art. Leucodyes and NIPAM change from a first color to a transparent state at a particular activation temperature. Thermochromatic liquid crystals are a class of crystals in which the atoms are ordered in a particular manner that gives the crystals unique chromatic properties. When heated, the atom/molecules arranges to a particular configuration that causes the molecules to interact with light in a different way (i.e., change color). Leucodyes and NIPAM may be tuned to become transparent at a selected or desired activation temperature. Thermochromatic liquid crystals may be tuned to change from a first color to a second color at a desired activation temperature, for example, within a temperature range that is practical for the generation of an identification character. In one embodiment, temperature increases in increments of about 3° F. to about 6° F. may activate a change from a colored state to a transparent state for leucodyes printed on patch 115. Thermochromatic liquid crystal inks may be formulated to activate a color change with temperature changes of less than 1° F. The range in which thermochromatic dyes of patch 115 may be activated may be between about 30° F. to about 200° F. Activation temperatures for thermochromatic dyes, inks, or materials are known in the art, as such, a detailed description is not provided herein. The thermochromatic inks/dyes may be deposited on the layers with a screen printing process or other methods known in the art.

Figure 3A:
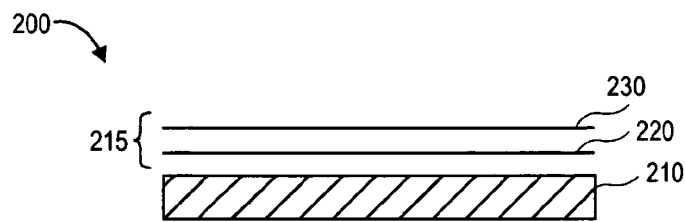
FIG. 3A illustrates a cross-sectional side view of another embodiment of a multi-layered thermochromatic patch.
Figure 3B:
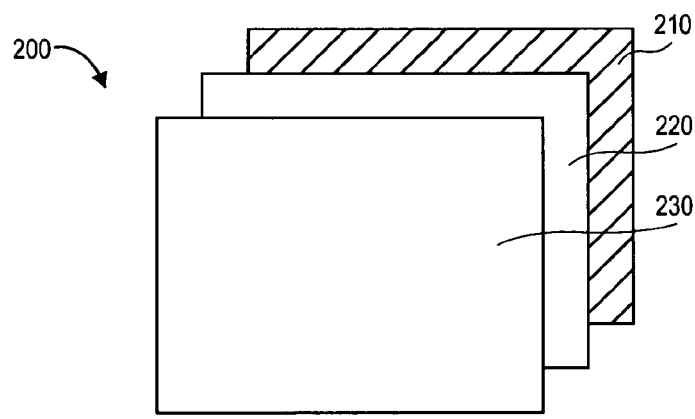
FIG. 3B illustrates an exploded view of the multi-layered thermochromatic patch of FIG. 3A.
Figure 3C:
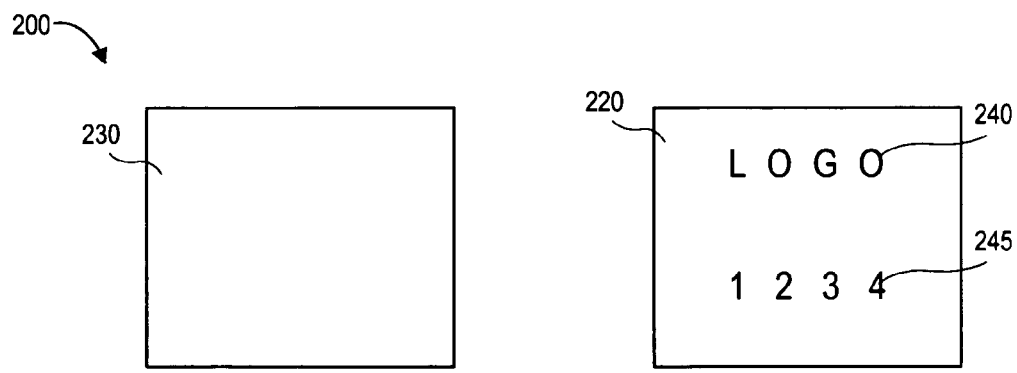
FIG. 3C illustrates a separated view of the multi-layered thermochromatic patch of FIG. 3A.

FIGS. 3A–3C illustrate various perspectives of an alternative embodiment of an identification patch printed with thermochromatic inks or dyes. Semiconductor package 200 includes a multi-layer patch 215 that has a combination of thermochromatic inks to generate a unique chromatic identification character for semiconductor package 200. Unlike patch 115 described above, patch 215 requires fewer thermochromatic layers to provide similar levels of sophistication and security. As shown in cross-sectional view of FIG. 3A, a first layer 220 is disposed above substrate 210, and a second layer 230 is disposed above first layer 220. As such, second layer 230 is the topmost layer and first layer 220 is the bottommost layer with respect to substrate 210. As shown in the exploded view of FIG. 3B, first and second layers 220, 230 may be substantially similar in size and shape and disposed directly on top of each other when positioned above substrate 210. The layers of patch 215 are represented generically for clarity of explanation, but it may be appreciated that layers 220, 230 may be of any shape and size.

FIG. 3C illustrates first layer 220 separated from second layer 230 in order to describe the thermochromatic nature of each layer. Second layer 230 may be deposited or printed with a thermochromatic ink that changes from a colored state to a transparent state (e.g., leucodye). First layer 220 may be deposited with a first thermochromatic marking 240, represented by the mark "LOGO," and a second thermochromatic marking 245, represented by the mark "1234." In one embodiment, first and second markings 240, 245 may include a color changing ink such as liquid crystal. First marking 240 has a different activation temperature relative to second marking 245; that is, the markings may be disposed adjacent to or very close together on first layer 220 but change colors at different temperatures. As such, a unique chromatic pattern may be generated on first layer 220 only by first and second markings 240, 245.

Figure 4A:
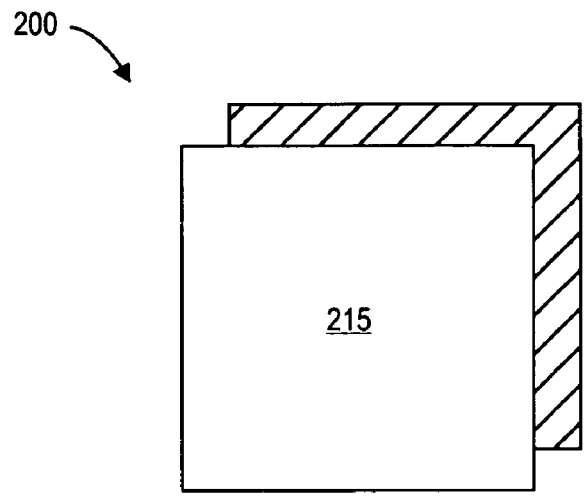
FIGS. 4A–4C illustrate one embodiment of the progression of generating an image by the multi-layered thermochromatic patch of FIGS. 3A–3C.
Figure 4B:
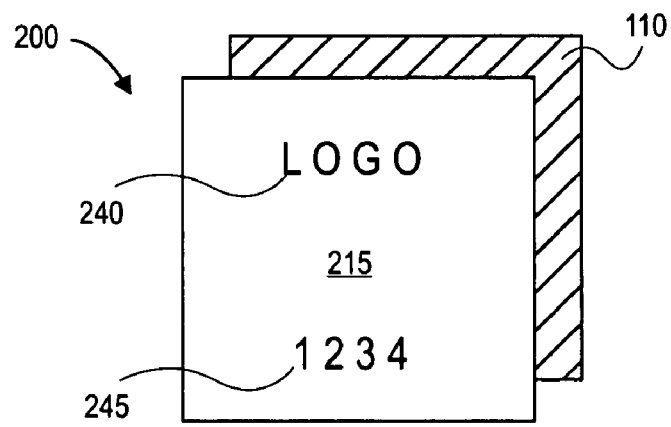
Figure 4C:
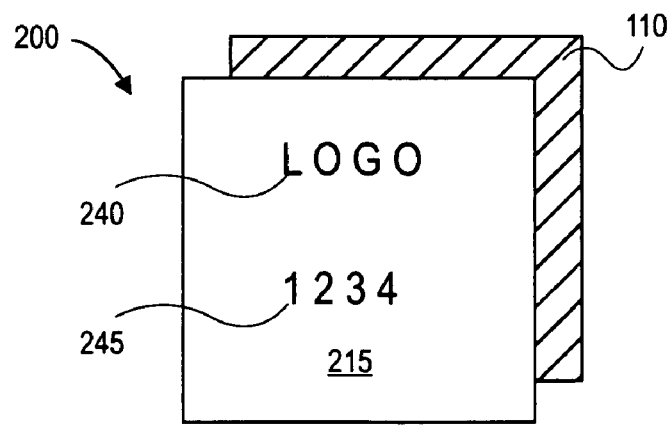

FIGS. 4A–4C illustrate the progression of displaying an identification character on patch 215 disposed above substrate 210 with the thermochromatic combination of first layer 220 and second layer 230. As such, FIGS. 4A–4C should be understood with respect to semiconductor package 200 described above with respect to FIGS. 3A–3C. FIG. 4A illustrates a three-dimensional view of patch 215 disposed above substrate 210. In one embodiment, patch 215 is under ambient temperatures, or within an operating temperature range for semiconductor package 200 (i.e., below the activation temperatures for the thermochromatic inks/dyes). Under such conditions, no identification markings or characters are visible under layer 230. Alternatively, the operating temperature of semiconductor package 200 may be within the activation temperature range of the thermochromatic inks. As described above, layer 230 may include a leucodye, NIPAM ink or similar material that changes from opaque to transparent states with temperature changes. As the temperature of patch 215 is increased, an activation temperature for second layer 230 is reached, resulting in second layer becoming transparent to reveal first and second thermochromatic markings 240, 245, as shown in FIG. 4B.

As the temperature of patch 215 continues to increase, an activation temperature of first thermochromatic marking 240 is reached, resulting in the "LOGO" changing from a first color to a second color (e.g., black to red). At an even higher temperature, the second thermochromatic marking 245 is activated, resulting in the "1234" changing from a first color to a second color (e.g., green to violet). As such, the true identification character for patch 215 combines revealing the first and second thermochromatic markings as well as triggering a unique color for each.

Figure 5A:
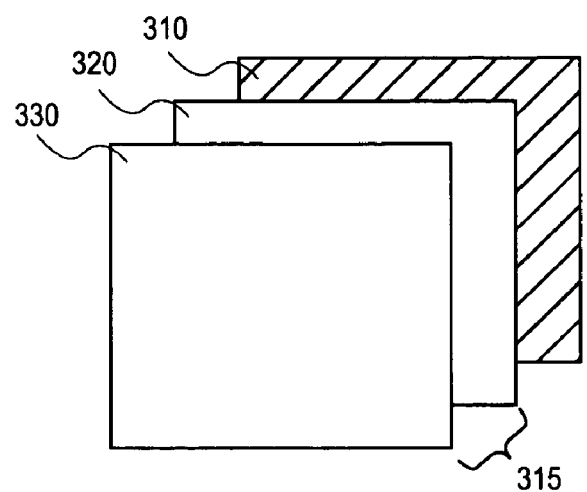
FIG. 5A illustrates an exploded view of another embodiment of a multi-layered thermochromatic patch.
Figure 5B:
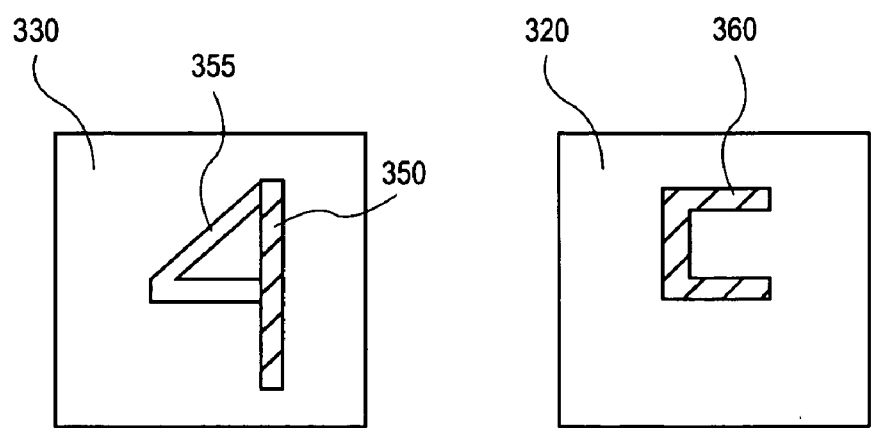
FIG. 5B illustrates separated view of the multi-layered thermochromatic patch of FIG. 5A.

In an alternative embodiment of the present invention, a combination of thermochromatic and non-thermochromatic inks may be disposed within a multi-layer patch to add another level or security and sophistication to the identification character/marking. By printing a portion of the identification character in non-thermochromatic ink, another portion in thermochromatic ink, and superimposing both portions over a full thermochromatic layer with yet another portion of the character below the full thermochromatic layer, the identification character may be changed entirely. FIGS. 5A–5B illustrate different perspectives of a semiconductor package 300 having a multi-layered identification patch 315 printed with both thermochromatic and non-thermochromatic inks. As shown in FIG. 5A, first layer 320 is disposed above substrate 310 and second layer 330 is disposed above first layer 320. As such, second layer 330 is the topmost layer and first layer 320 is the bottommost layer with respect to substrate 310.

FIG. 5B illustrates the two layers of patch 315 separated from each other and showing portions of the identification character. Second layer 330 includes a combination of non-thermochromatic and thermochromatic portions to make the number "4." That is, the down stroke portion 350 of the number is printed on second layer 340 with non-thermochromatic ink. In one embodiment, down stroke portion 350 may be a permanent ink that is not effected by temperature. The diagonal and side strokes 355 of the number may be printed with a thermochromatic ink (e.g., a leucodye) that becomes transparent at a particular activation temperature. Second layer 330 may be printed entirely with a leucodye that becomes transparent at a different activation temperature relative to strokes 355. First layer 320 includes a combination of downward and side strokes 360 printed with another permanent ink.

Figure 6A:
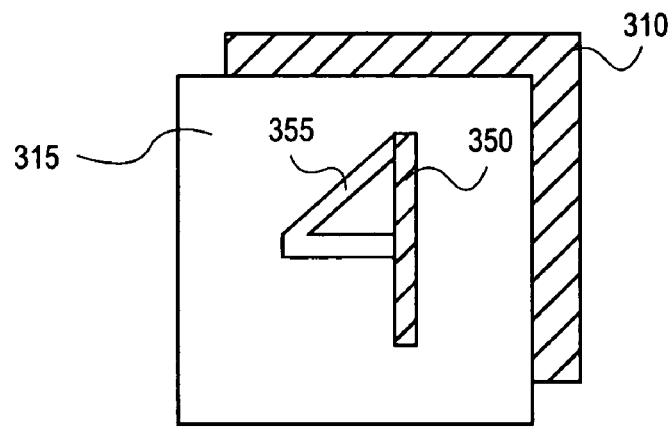
FIGS. 6A–6C illustrate one embodiment of the progression of generating an image by the multi-layered thermochromatic patch of FIGS. 5A–5B.
Figure 6B:
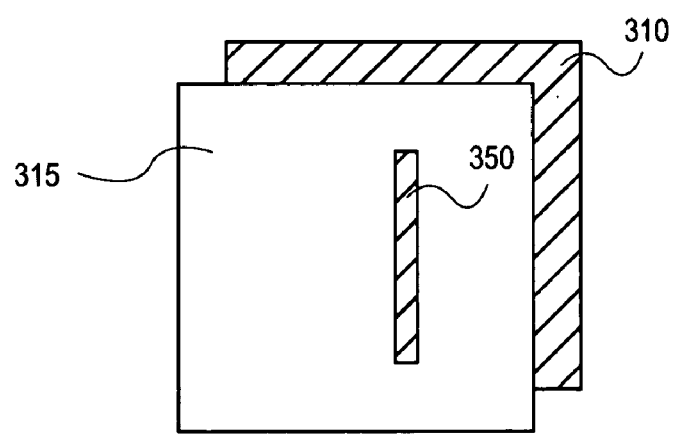
Figure 6C:
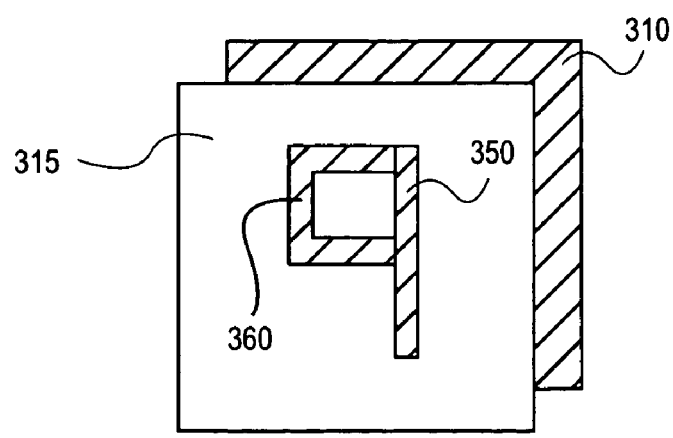

FIGS. 6A–6C illustrate the progression of displaying a unique identification character from patch 315 of semiconductor package 300 that goes through a series of activation temperatures. A first or perceived identification character or mark shifts to another character. At a starting or resting temperature, patch 315, as illustrated in FIG. 6A, shows what appears to be the marking of the number "4." As illustrated in FIG. 6B, as the temperature of patch 315 increases, an activation temperature of character portion 355 is reached and character portion 355 becomes transparent, leaving only the down stroke portion 350 visible (which is printed in permanent ink). At another activation temperature, second layer 330 becomes transparent to expose strokes 360 that is printed on layer 320 with permanent ink. As such, the number marking that first appeared as a "4," now appears as a "9." This embodiment is described with respect to one character, but alternative embodiments may be include multiple characters and more than two layers that combine thermochromatic and non-thermochromatic inks. Alternatively, a separate, leucodye-based thermochromatic layer (not shown) may be disposed above second layer 330 that requires thermo-activation to reveal the strokes 350, 355. In yet another alternative embodiment, a combination of a leucodye-type of thermochromatic ink may be printed over a permanent ink marking to invoke a color change in a character marking. For example, the number "4" may first be printed with permanent ink in the color red followed by a leucodye print in black. When an activation temperature for the leucodye ink is reached, the number changes from black to red.

Embodiments of the present invention described above are just several of many possible schemes that may be used to provide complex and non-reproducible security devices. The variable schemes include, but are not limited to, number, size, shape, position of layers in the patch (e.g., patch 115), specific activation temperature of each layer, type of identification encryption, and construction of character or pattern matrix containing the encrypted ID. Other schemes include distribution of the characters, patterns, or portions of characters throughout the layers, alignment of characters from layer to layer, selection of color for each layer, and selection of color for each character or portion of a character.

Figure 7A:
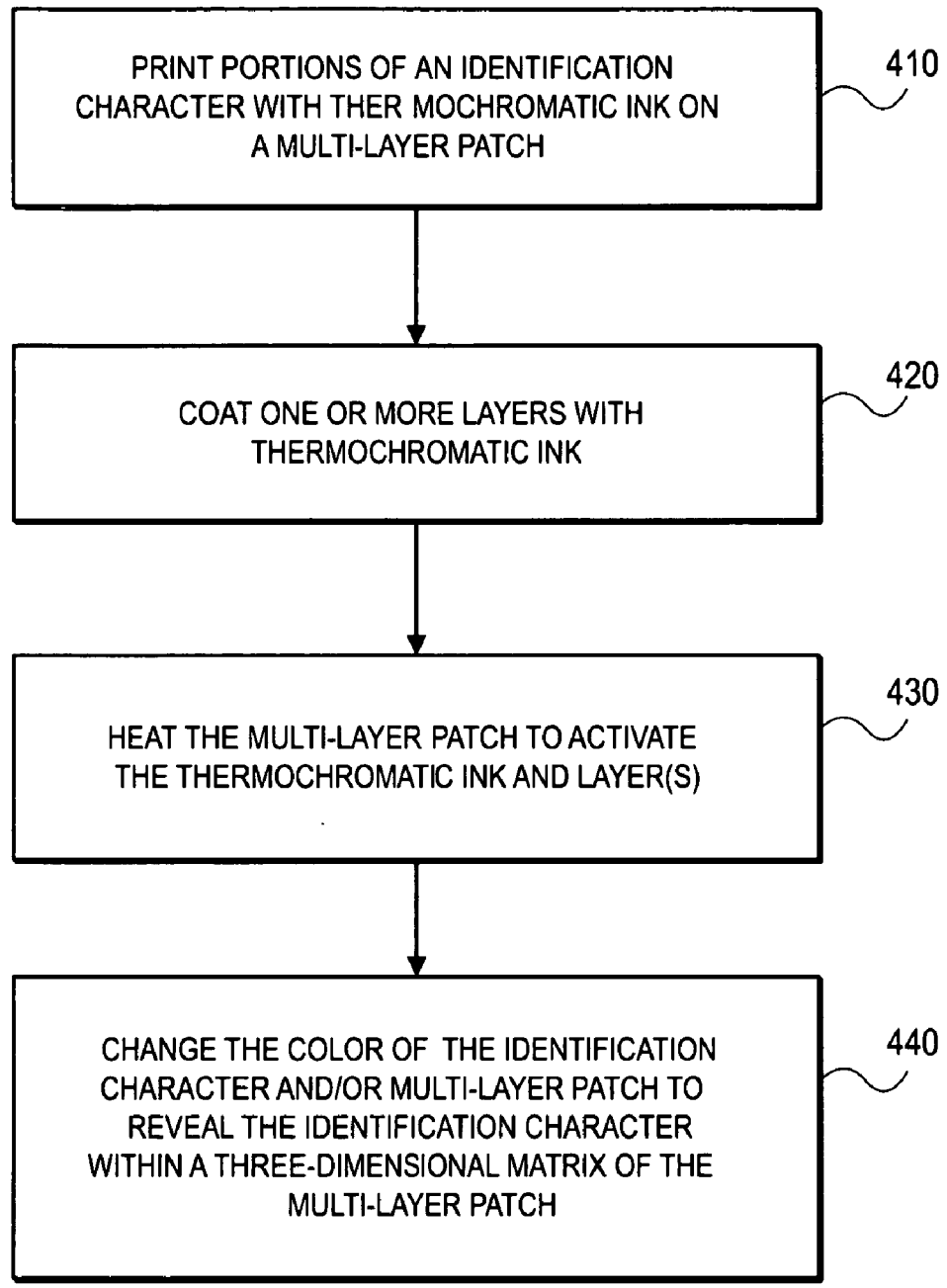
FIG. 7A illustrates one method for forming identification characters with thermochromatic inks within a three-dimensional matrix of a multi-layer patch.
Figure 7B:
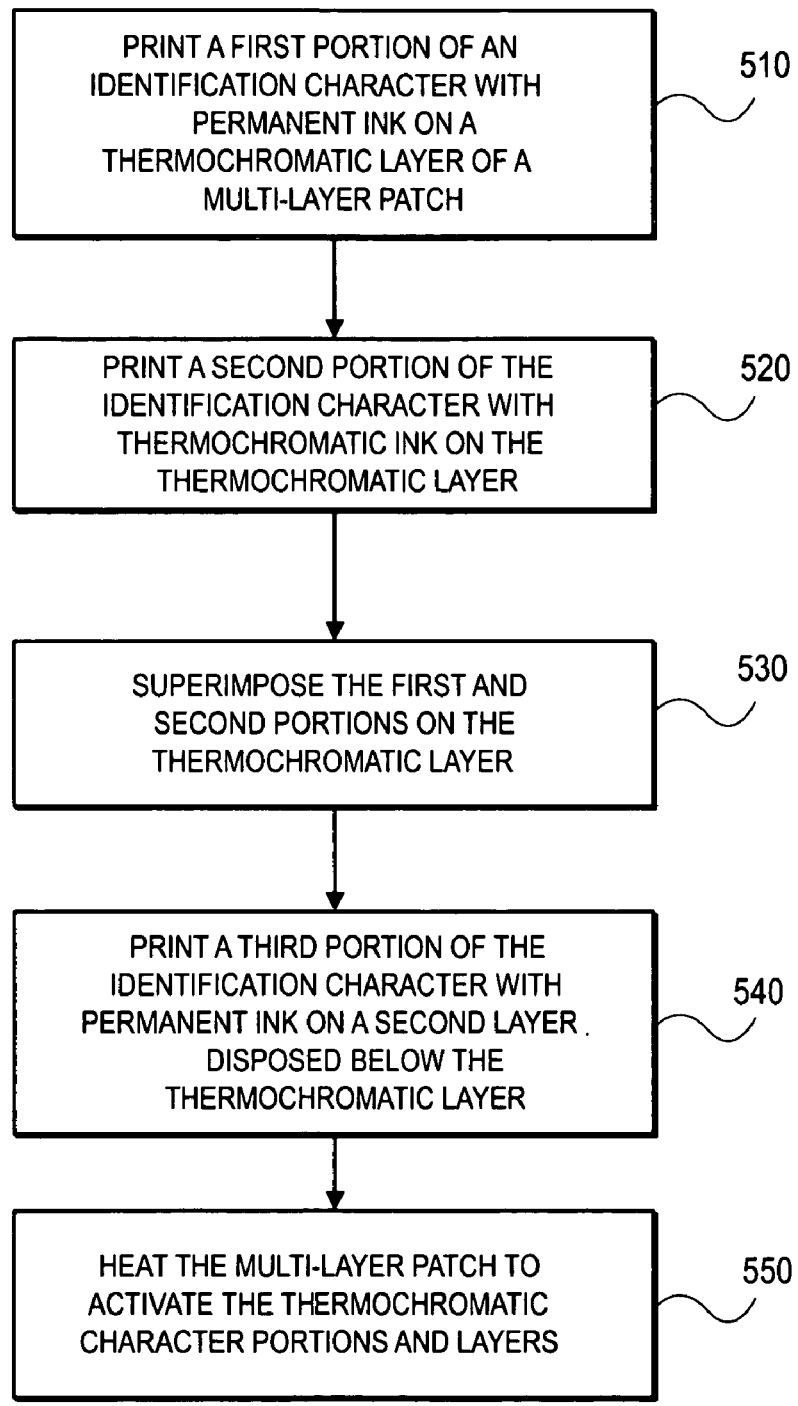
FIG. 7B illustrates another method for forming identification characters with thermochromatic inks within a three-dimensional matrix of a multi-layer patch.
Figure 7C:
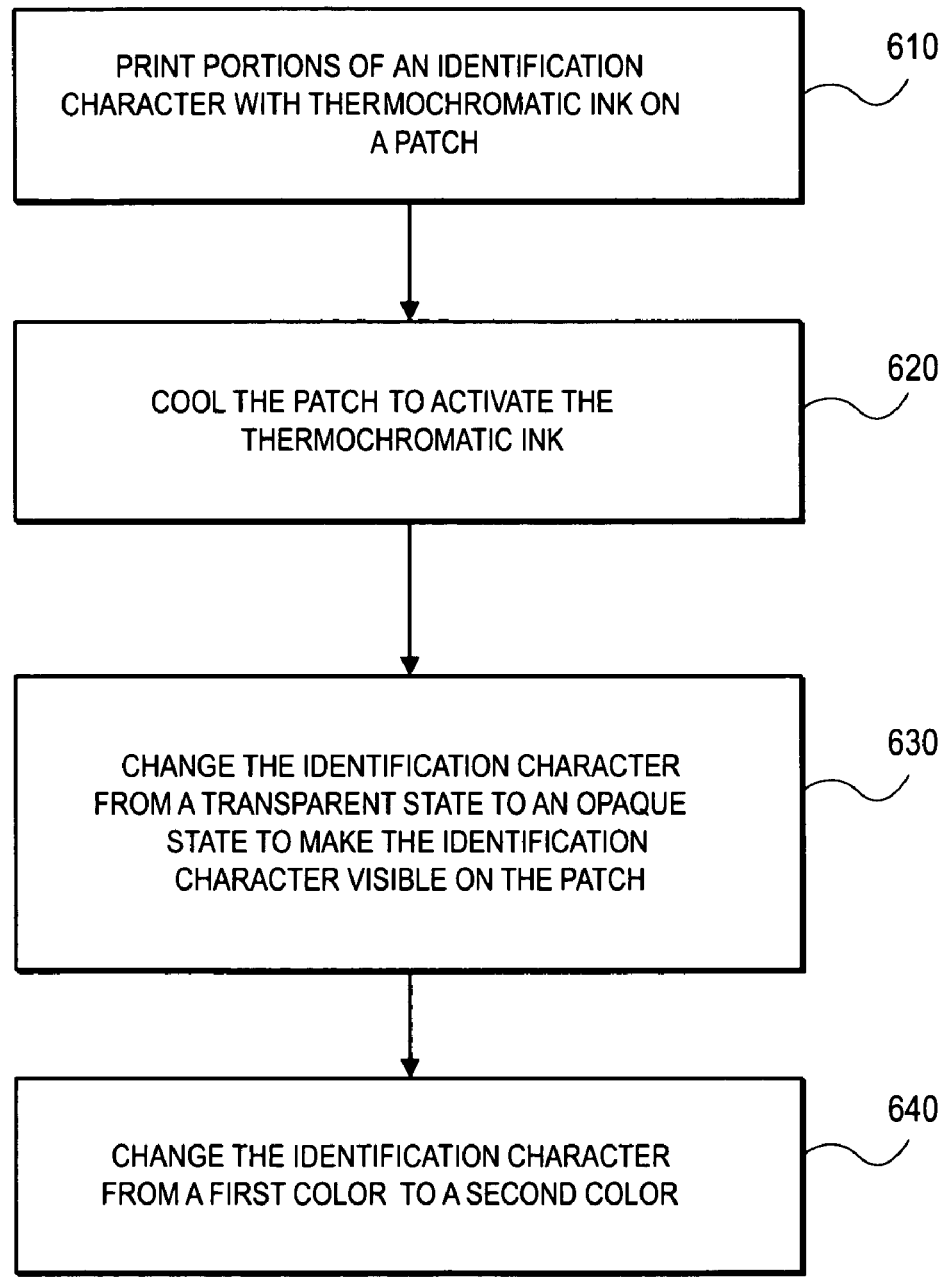
FIG. 7C illustrates another method for forming identification characters with thermochromatic inks within a three-dimensional matrix of a multi-layer patch.

FIGS. 7A–7C illustrate methods for forming identification characters with thermochromatic inks within a three-dimensional matrix of a multi-layer patch. The multi-layered patch may be disposed on a substrate that is part of the packaging of a semi-conductor based device to provide a security feature, such as guarding against counterfeiting. For example, the identification character embedded within the multi-layer patch may be used to cross-check against a visible identification character disposed elsewhere on the packaging. As shown in FIG. 7A, in one method, portions of an identification character (e.g., first and second markings 160, 165) may be printed with thermochromatic ink on a multi-layer patch, block 410. The thermochromatic inks may be the type that change color at a particular temperature (e.g., liquid crystal) or the type that becomes transparent at a particular activation temperature (e.g., leucodye). Alternatively, one or more of the layers may be entirely coated with a thermochromatic ink, block 420. The thermochromatic inks may be applied to the layers by a screen-printing or similar printing process. Other processes for applying the thermochromatic inks include dipping, painting, spraying, and other techniques known in the art.

The temperature of the patch is raised to activate the thermochromatic inks, block 430. In one embodiment of the present invention, the different portions of the identification character have unique activation temperatures such that color activation does not occur at one temperature. For example, at a first activation temperature, one portion of the identification may change color. At a second (higher) activation temperature, another portion of the identification character may change color, or one of the layers may become transparent. The temperature of the patch is continually raised until all the thermochromatic inks have been activated to reveal the complete and true identification character within the three-dimensional matrix or arrangement of the multi-layer patch, block 440. Alternatively, the complete and true identification character may be designated as a temporary or transitional form as the thermochromatic inks undergo color changes.

FIG. 7B illustrates an alternative method for forming identification characters with thermochromatic inks within a three-dimensional matrix of a multi-layer patch. The identification character(s) may be divided into multiple portions and distributed among the multiple layers of the patch (e.g., patch 315). A first portion of an identification character (e.g., 350) is printed with permanent ink on a thermochromatic layer of the multi-layer patch, block 510. A second portion of the identification character (e.g., 355) is printed with thermochromatic ink on the same thermochromatic layer as the first character portion, block 520. The first and second portions may be printed by screen printing or other printing methods known in the art. The first and second portions of the identification character are then superimposed on the thermochromatic layer, block 530. A third portion of the identification character (e.g., 360) is printed with permanent ink on a second layer disposed below the thermochromatic layer, block 540. The multi-layer patch is then heated through a series of temperatures to activate color changes in the thermochromatic inks of the multi-layer patch, block 550. It may be appreciated that the order of printing the thermochromatic and permanent inks are not limited to order described above, but may be in any order.

The combination of permanent and thermochromatic inks provides for the shifting of an initial character to an entirely different character to reveal the true and complete identification character. For example, before the temperature of the multi-layer patch is raised, the first and second character portions form an initial character. A first activation temperature causes the second portion of the identification portion to become transparent, leaving only the first character portion formed by permanent ink. When a second activation temperature is reached, the thermochromatic layer becomes transparent to reveal the third character portion (printed with permanent ink). The first and third character portions form an entirely different character than that formed by the first and second portions.

FIG. 7C illustrates an alternative method for forming identification characters with thermochromatic inks on patch. This method does not require multiple layers or the distribution of character portions within a three-dimensional matrix of a patch. All or portions of an identification character are printed with thermochromatic ink on a patch, block 610. In one embodiment, a color disappearing ink such as leucodyes or NIPAM may be used. The activation temperature of the thermochromatic ink may be selected such that by default, the identification character is not visible (i.e., the ambient temperature for the product activates a change from an opaque to a transparent state). The patch is then cooled to a particular temperature to "activate" the thermochromatic ink and change the state of the ink, block 620. This causes the character portions to become opaque and be visible on the patch, block 630. Alternatively, a leucodye character portion having a one color may be printed over a permanent-ink character portion having a different color. Be default, the leucodye is in a transparent state such that the character portion exhibits the color of the permanent ink. Upon cooling the patch, the leucodye portion revives its color to cover the permanent ink character portion to change the character from a first color to a second color, block 640.

It should be understood from the foregoing descriptions that each layer could contain as many characters or portions of characters as can be printed, either overlying or offset from those in layers above or below, using either permanent or thermochromatic ink, to create a unique identification scheme as determined by the user. It also should be apparent that a patch could include numerous separate layers, each with distinctive activation temperatures. The true and complete actual identification string or scheme can be visible either before reaching the first activation temperature, after the final activation temperature, or somewhere in between. It can be comprised of characters all in one layer, characters in multiple layers, or portions of characters from multiple layers. When multiple thermochromatic layers are used, they may all be of the same size and shape, or they may vary in size and/or shape from layer to layer. If desired, a complete identifying character string may be composed of elements of two adjacent patches, each possessing different embodiments of the present invention.

In the foregoing specification, the invention has been described with reference to specific exemplary embodiments thereof. It will, however, be evident that various modifications and changes may be made thereto without departing from the broader spirit and scope of embodiments of the invention as set forth in the appended claims. The specification and figures are, accordingly, to be regarded in an illustrative rather than a restrictive sense.

What is claimed is:

1. An apparatus, comprising:
   a substrate; and
   a multi-layer patch disposed above the substrate, wherein portions of an identification character printed with thermochromatic ink are distributed within each of three-dimensional matrix layer of the multi-layer patch.

2. The apparatus of claim 1, wherein a topmost layer of the multi-layer patch, relative to the substrate, has a lower activation temperature than a bottommost layer.

3. The apparatus of claim 1, wherein the character portions of the identification character have unique activation temperatures.

4. The apparatus of claim 3, wherein the identification character is not revealed until all the character portions reach a unique activation temperature.

5. The apparatus of claim 1, wherein the thermochromatic ink comprises a leucodye to change from a first color to a transparent state.

6. The apparatus of claim 1, wherein the thermochromatic ink comprises a liquid crystal to change from a first color to a second color.

7. The apparatus of claim 1, wherein the substrate comprises a semi-conductor based package.

8. An apparatus, comprising:
   a substrate;
   a first layer disposed above the substrate having a first portion of an identification character, and
   a second layer disposed above the first layer having a second portion printed with thermochromatic ink and a third portion printed with non-thermochromatic ink, wherein the identification character is distributed within a three-dimensional matrix of the first and second layers.

9. The apparatus of claim 8, wherein the first and third portions are printed with permanent ink.

10. The apparatus of claim 8, wherein the second layer is thermochromatic.

11. The apparatus of claim 8, wherein the second portion and the second layer comprise a leucodye.

12. The apparatus of claim 11, wherein the second portion has a first activation temperature and the second thermochromatic layer has a second activation temperature.

13. The apparatus of claim 12, wherein a temporary identification character is formed by the second and third portions and the identification character is formed by the first and third portions.

14. The apparatus of claim 12, wherein the first and second activation temperatures are within a range about 30° F. to about 200° F.

15. The apparatus of claim 8, wherein the substrate comprises a semi-conductor based package.

* * * * *

UNITED STATES PATENT AND TRADEMARK OFFICE
CERTIFICATE OF CORRECTION

PATENT NO.       : 7,154,170 B2
APPLICATION NO.  : 10/816408
DATED            : December 26, 2006
INVENTOR(S)      : Boyd It is certified that error appears in the above-identified patent and that said Letters Patent is hereby corrected as shown below:

In column 3, at line 10, delete "1 10." and insert --110.--.
In column 10, at line 31, delete first occurrence of ".".

Signed and Sealed this

Thirtieth Day of October, 2007

JON W. DUDAS
*Director of the United States Patent and Trademark Office*